United States Patent
Joshi et al.

(10) Patent No.: US 9,560,790 B2
(45) Date of Patent: Jan. 31, 2017

(54) POWER ELECTRONICS COOLING SYSTEM WITH TWO-PHASE COOLER

(71) Applicant: Toyota Motor Engineering & Manufacturing North America, Inc., Erlanger, KY (US)

(72) Inventors: Shailesh N. Joshi, Ann Arbor, MI (US); Ercan M. Dede, Ann Arbor, MI (US)

(73) Assignee: TOYOTA MOTOR ENGINEERING & MANUFACTURING NORTH AMERICA, INC., Erlanger, KY (US)

(*) Notice: Subject to any disclaimer, the term of this patent is extended or adjusted under 35 U.S.C. 154(b) by 0 days.

(21) Appl. No.: 14/710,679

(22) Filed: May 13, 2015

(65) Prior Publication Data

US 2016/0338225 A1     Nov. 17, 2016

(51) Int. Cl.
*H05K 7/20* (2006.01)
*H01L 23/473* (2006.01)

(52) U.S. Cl.
CPC ...... *H05K 7/20318* (2013.01); *H05K 7/20309* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 5,924,482 | A * | 7/1999 | Edwards | F28D 15/02 165/104.21 |
| 6,052,285 | A * | 4/2000 | Hileman | H05K 7/20354 165/104.14 |
| 7,104,080 | B2 | 9/2006 | Albertson | |
| 8,786,078 | B1 | 7/2014 | Rau et al. | |
| 2003/0066625 | A1* | 4/2003 | Kirshberg | B82Y 30/00 165/80.3 |
| 2004/0179338 | A1* | 9/2004 | Belady | F28D 15/0266 361/700 |

(Continued)

FOREIGN PATENT DOCUMENTS

| | | |
|---|---|---|
| EP | 2703763 | 5/2014 |
| WO | 2014033174 | 3/2014 |

OTHER PUBLICATIONS

Kitanoski, et al. "Principal Aspects and Simulation of a Hybrid Demonstrator Vehicle's Cooling System"; http://www.tesisdynaware.com/fileadmin/Downloads/Referenzen/Simulation_Hybrid_Cooling_System.pdf; Publication: SAE International; Publication Year: 2007.

(Continued)

*Primary Examiner* — Anthony Haughton
*Assistant Examiner* — Razmeen Gafur
(74) *Attorney, Agent, or Firm* — Dinsmore & Shohl LLP

(57) ABSTRACT

Cooling systems and vehicles containing cooling systems are disclosed. A cooling system may include an evaporator, a condenser positioned downstream from the evaporator, a pump positioned downstream from the condenser, and a two phase cooler positioned downstream from the pump and in series upstream from the evaporator. The two phase cooler may receive thermal energy from a heat generating device to preheat a working fluid and directs the preheated working fluid to the evaporator.

20 Claims, 4 Drawing Sheets

(56) References Cited

U.S. PATENT DOCUMENTS

| | | | |
|---|---|---|---|
| 2005/0063158 A1* | 3/2005 | Thiele | F28D 15/0266 361/700 |
| 2005/0067155 A1* | 3/2005 | Thayer | F25B 23/006 165/172 |
| 2005/0219819 A1* | 10/2005 | Pokharna | G06F 1/20 361/700 |
| 2006/0005948 A1* | 1/2006 | Sauciuc | F28D 15/0241 165/104.25 |
| 2006/0137860 A1* | 6/2006 | Prasher | F28D 15/0266 165/104.33 |
| 2008/0036076 A1* | 2/2008 | Ouyang | H01L 23/34 257/714 |
| 2008/0049384 A1* | 2/2008 | Unternaehrer | H02G 5/10 361/677 |
| 2009/0002948 A1* | 1/2009 | Jarlestal | B64D 13/00 361/701 |
| 2009/0268404 A1* | 10/2009 | Chu | H05K 7/20836 361/696 |
| 2012/0140404 A1* | 6/2012 | Peterson | G06F 1/20 361/679.47 |
| 2012/0186290 A1 | 7/2012 | Howes et al. | |
| 2012/0216535 A1* | 8/2012 | Schill | F01K 9/003 60/641.8 |
| 2013/0050931 A1* | 2/2013 | Heiland | H05K 7/20827 361/679.33 |
| 2013/0077245 A1* | 3/2013 | Gradinger | F28D 1/035 361/700 |
| 2013/0104592 A1* | 5/2013 | Cottet | H05K 7/20672 62/419 |
| 2013/0107455 A1* | 5/2013 | Cottet | H05K 7/20672 361/694 |
| 2013/0340978 A1* | 12/2013 | Agostini | H05K 7/20309 165/104.21 |
| 2014/0055949 A1* | 2/2014 | Campbell | F28D 1/0471 361/691 |
| 2014/0218859 A1* | 8/2014 | Shelnutt | G06F 1/206 361/679.46 |
| 2014/0376187 A1* | 12/2014 | Baba | H01L 23/473 361/699 |
| 2015/0173242 A1* | 6/2015 | Blomberg | F28D 15/0266 62/259.2 |
| 2015/0241094 A1* | 8/2015 | Blomberg | F25B 39/02 62/119 |

OTHER PUBLICATIONS

"Evaluation of Two-Phase Cold Plate for Cooling Electric Vehicle Power Electronics"; http://proceedings.asmedigitalcollection.asme.org/proceeding.aspx?articleid=1645782 Publication: The America Society of Mechanical Engineers; Publication Date: Nov. 17, 2011.

* cited by examiner

POWER ELECTRONICS COOLING SYSTEM WITH TWO-PHASE COOLER

TECHNICAL FIELD

The present specification generally relates to cooling systems for power electronics and more specifically, to Rankine cycle cooling systems that incorporate a two phase cooler.

BACKGROUND

Electronic components, such as, for example, electronic circuits and components thereof, semiconductor chips, and/or the like from power electronics devices generate heat under normal operation. The generated heat can be detrimental to the electronic components and/or surrounding components if it is not appropriately dissipated. Certain existing systems and methods may incorporate various cooling apparatuses for cooling the electronic components. However, such systems and methods are inefficient and do not sufficiently cool the electronic components to avoid heat related damage. Moreover, certain systems require additional components that are difficult to integrate and/or consume excessive amounts of energy to function. In addition, certain systems may waste the heat that is generated by the electronic components.

Accordingly, a need exists for cooling systems that provide an efficient means of thoroughly cooling electronic components that is easily integrated with existing cooling systems, does not require extra energy to function, and does not waste the heat that is generated by the electronic components.

SUMMARY

In one embodiment, a cooling system includes an evaporator, a condenser positioned downstream from the evaporator, a pump positioned downstream from the condenser, and a two phase cooler positioned downstream from the pump and in series upstream from the evaporator. The two phase cooler receives thermal energy from a heat generating device to preheat a working fluid.

In another embodiment, a cooling system includes an evaporator, a condenser positioned downstream from the evaporator, a pump positioned downstream from the condenser, and a two phase cooler positioned downstream from the pump and in parallel with the evaporator. The evaporator and the two phase cooler each receive thermal energy to heat a working fluid.

In yet another embodiment, a vehicle includes a power electronics device and an evaporator that receives a stream of waste heat. The evaporator transfers thermal energy from the waste heat to a working fluid to vaporize the working fluid. The vehicle further includes an expander positioned downstream from the evaporator. The expander receives the vaporized working fluid from the evaporator, allows the vaporized working fluid to expand, and produces work from the expanded working fluid. The vehicle also includes a condenser positioned downstream from the expander. The condenser receives the expanded vaporized working fluid from the expander and cools the expanded vaporized working fluid to a liquid working fluid. The vehicle also includes a pump positioned downstream from the condenser. The pump draws the liquid working fluid from the condenser. The vehicle also includes a cooler positioned downstream from the pump and upstream from the evaporator such that the liquid working fluid is pumped into the cooler from the condenser. The cooler receives thermal energy from the power electronics device to preheat the liquid working fluid and directs the preheated working fluid to the evaporator.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

The systems and methods described herein are generally directed to a power electronics cooling system that includes a Rankine cycle cooling system integrated with a two-phase cooler therein. The two phase cooler obtains heat from one or more vehicle electronic devices, such as, for example, one or more power electronics devices within an electrified vehicle, and uses such heat to preheat working fluid as it enters an evaporator portion of the Rankine cycle cooling system. Thus, embodiments described herein may generally be more efficient than traditional Rankine cycle cooling systems without increasing the complexity of the cooling system. Accordingly, the power electronics cooling system may be easier to implement, may cost less to manufacture, and may generate additional cooling capacity without the need for significant equipment additions, modifications, and power requirements.

As used herein, the term "heat" may generally refer to an environmental condition associated with temperature. Thus, heat may include any type of thermal mass or thermal energy. As such, the terms "heat," "thermal mass," and "thermal energy" may be used interchangeably herein.

As used herein, a "Rankine cycle" refers to a cooling system that includes a circuit, loop, or cycle of components arranged in a particular order to move a fluid in a cyclic manner through the various components. As will be described in greater detail herein, the Rankine cycle includes at least an evaporator, an expander, a condenser, and a pump, among other components.

Figure 1:
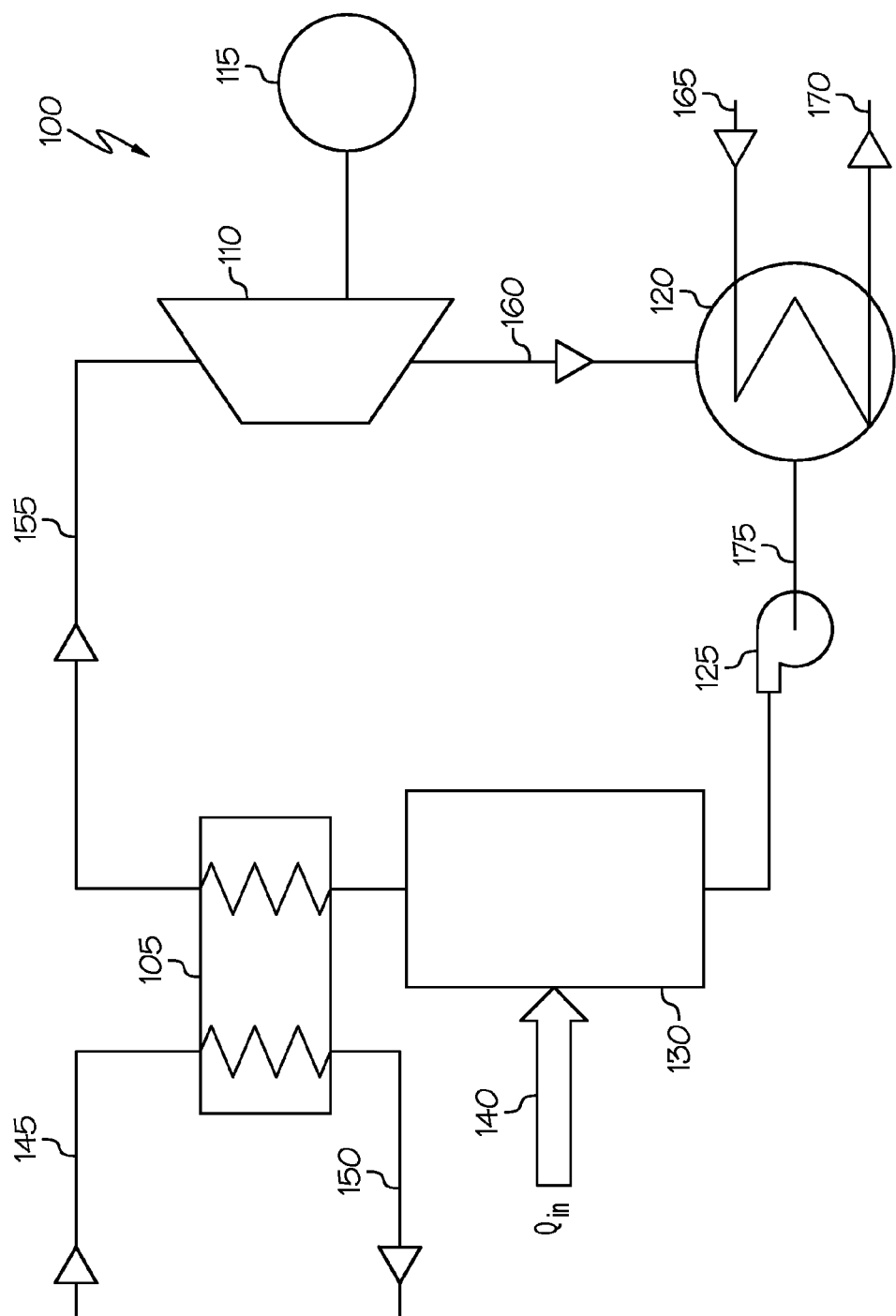
FIG. 1 depicts a block diagram of an illustrative cooling cycle according to one or more embodiments shown and described herein.

FIG. 1 depicts an illustrative power electronics cooling system containing a Rankine cycle, generally designated 100, according to an embodiment. Except as described in greater detail herein, the system 100 may be a generally recognized Rankine cycle system. Thus, the system may include, for example, an evaporator 105, an expander 110 located downstream from the evaporator, a condenser 120 located downstream from the expander, and a pump 125 located downstream from the condenser. A cooler, such as a two phase cooler 130 or the like, is located downstream from the pump 125 and provides heated working fluid to the evaporator 105 (or functions in parallel to the evaporator), as described in greater detail herein. While the cooler is referred to as a two phase cooler herein, such terms may be used interchangeably. While FIG. 1 only depicts one evaporator 105, one expander 110, one condenser 120, one pump 125, and one two phase cooler 130, it should be understood that the system 100 may include a plurality of each component without departing from the scope of the present disclosure. Thus, the description herein, while referring to each component in singular form is meant to include a plurality of each component.

Following the flow of the working fluid within the system 100, a liquid working fluid is located within the condenser 120. During operation, the pump 125 may pull the liquid working fluid from the condenser 120 via a first conduit 175 and may move the working fluid downstream to the two phase cooler 130 and/or the evaporator 105. The evaporator 105 may obtain streams of waste heat 145 from various sources (not shown), such as, for example, combustion engine sources. Additionally, heat 140 provided to the two phase cooler 130 may be used to preheat the working fluid prior to the working fluid reaching the evaporator 105. In some embodiments, the streams of waste heat 145 and the heat 140 provided to the two phase cooler 130 may come from the same source. The two phase cooler 130 and the evaporator 105 may work in conjunction to heat the working fluid such that it boils and vaporizes, as described in greater detail herein. The vaporized working fluid may move downstream via a second conduit 155 to the expander 110, which causes the vaporized fluid to cool and lose pressure, thereby powering a turbine 115 and/or the like. The turbine 115 may be used to generate electric power (e.g., to electrically power the pump 125). The cooled and depressurized working fluid may flow back into the condenser 120 via a third conduit 160, where it is further cooled into a liquid state.

In various embodiments, the working fluid may generally be a fluid commonly used in Rankine cycle cooling systems. The working fluid may be either an organic or a non-organic working fluid. Illustrative working fluids may include any water, alcohol, refrigerant, or combination thereof. Illustrative refrigerants may include, but are not limited to, ammonia, ethyl chloride, methyl chloride, sulphur dioxide, fluorocarbons, hydrocarbons, hydrofluorocarbons (HFC), and halogenated hydrocarbons. In a particular embodiment, the refrigerant may be a glycol compound. Illustrative glycol compounds include, but are not limited to, ethylene glycol, isopropylene glycol, 1,2-dimethylethylene glycol, diethylene glycol, diisopropylene glycol, bis(1,2-dimethylene) glycol, triethylene glycol, triisopropylene glycol, tetraethylene glycol, tetraisopropylene glycol, pentaethylene glycol, pentaisopropylene glycol, and the like, and mixtures thereof. In some embodiments, the refrigerant may be a dielectric material. Illustrative dielectric materials may include, but are not limited to, epoxy polymers, polyimides, polyesters, polyisoprenes, and/or the like. Other illustrative working fluids may include, but are not limited to, pentafluoropropane such as Genetron® R-245fa (Honeywell International Inc., Morristown, N.J.), Therminol® (Solutia Inc., St. Louis, Mo.), Dowtherm® (Dow Chemical Co., Midland, Mich.), Fluorinol® (American Nickeloid Company Corporation, Peru, Ill.), FLUORINERT™ (Minnesota Mining and Manufacturing Company, St. Paul, Minn.), toluene, dodecane, isododecane, methylundecane, neopentane, octane, methanol, and the like, and combinations thereof.

The evaporator 105 is not limited by this disclosure, and may generally be any heat exchanger now known or later developed to heat a working fluid from a liquid state to a vapor state. In some embodiments, the evaporator 105 may be a plurality of evaporators. Such a plurality of evaporators 105 may be arranged in series, in parallel, or any combination thereof. The evaporator 105 may receive heat, such as from the waste heat stream 145, and may transfer the heat to the working fluid via a heat transfer mechanism. The waste heat stream 145 is not limited by this disclosure, and may generally include any heat generated by the vehicle. Illustrative waste heat streams 145 may come from a vehicle exhaust, heat generated by power electronics components, and/or the like. In some embodiments, a waste heat stream 145 may come from the same source as the heat 140 provided to the two phase cooler. In some embodiments, the waste heat stream 145 may be released as an exhaust stream 150. The heat may be transferred from the waste heat stream 145 to the working fluid by any heat transfer mechanism or device now known or later developed, such as, for example, parallel tubes, heat transfer plates, heat transfer coils, and/or the like. In some embodiments, the mechanism or device may be made of a material suitable for heat transfer, such as, for example, aluminum or copper. Fluid movement through the evaporator 105 may include, but is not limited to, natural circulation, forced circulation, natural convection, and/or the like. Illustrative evaporators may include, but are not limited to, exhaust gas recirculation (EGR) heat exchangers, exhaust heat exchangers, recuperators, pre-charge air coolers, and/or the like.

In the illustrated embodiments, the working fluid is preheated by the two phase cooler 130 prior to flowing into the evaporator 105, as described herein. The two phase cooler 130 is thermally coupled to a heat generating device, such as a power electronics device. Preheating the working fluid may ensure that the evaporator 105 efficiently heats substantially all of the working fluid in the evaporator, thereby effectively converting substantially all of the working fluid to a vapor state. For example, preheating via the two phase cooler 130 may be beneficial in instances where the evaporator cannot transfer all of the heat from the waste stream 145 to the working fluid on its own, thereby resulting in a failure to vaporize all of the working fluid. Such a failure may cause the working fluid to backfill the evaporator 105 and cause damage. To preheat the working fluid that passes through the evaporator 105, the two phase cooler 130 may be positioned in series upstream from the evaporator. Accordingly, all working fluid received from the pump 125 may flow through the two phase cooler 130 for preheating before passing on to the evaporator 105.

The two phase cooler 130 may preheat the working fluid to any temperature, particularly temperatures generally recognized as being preheated fluids. Thus, the two phase cooler 130 may heat the working fluid to a first temperature and deliver the preheated working fluid to the evaporator 105, where it is further heated to a second temperature that is generally greater than the first temperature. For example, in some embodiments, the two phase cooler 130 may preheat the working fluid to a first temperature that is less than the boiling point of the fluid. Accordingly, the evaporator 105 may heat the working fluid to a second temperature that generally corresponds to the boiling temperature of the fluid. In a nonlimiting example, the first temperature may be, but is not limited to, about 1° C. to about 20° C. or more below the boiling point of the working fluid and/or the second temperature, including about 1° C., about 2° C., about 3° C., about 4° C., about 5° C., about 6° C., about 7° C., about 8° C., about 9° C., about 10° C., about 11° C., about 12° C., about 13° C., about 14° C., about 15° C., about 16° C., about 17° C., about 18° C., about 19° C., about 20° C., or any value or range between any two of these values (including endpoints).

In other embodiments, the working fluid may be heated by both the two phase cooler 130 and the evaporator 105 in tandem. As such, the two phase cooler 130 and the evaporator 105 may be arranged in parallel to each other such that both devices receive the working fluid from the pump 125 and vaporize the working fluid such that it flows to the expander 110. Accordingly, the two phase cooler 130 and the evaporator 105 may each, respectively, heat the working fluid to a temperature, such as a temperature that generally corresponds to a boiling point of the working fluid. Such a parallel configuration may allow the system 100 to heat more working fluid at a time, thereby ensuring a more efficient cooling process for various heat generating devices to which the system is connected. For example, in embodiments where the two phase cooler 130 receives heat 140 from a heat generating device and the evaporator 105 receives a waste heat stream 145, the system 100 may cool the heat generating device and transfer heat from the waste heat stream at the same time without any loss in efficiency.

Figure 2:
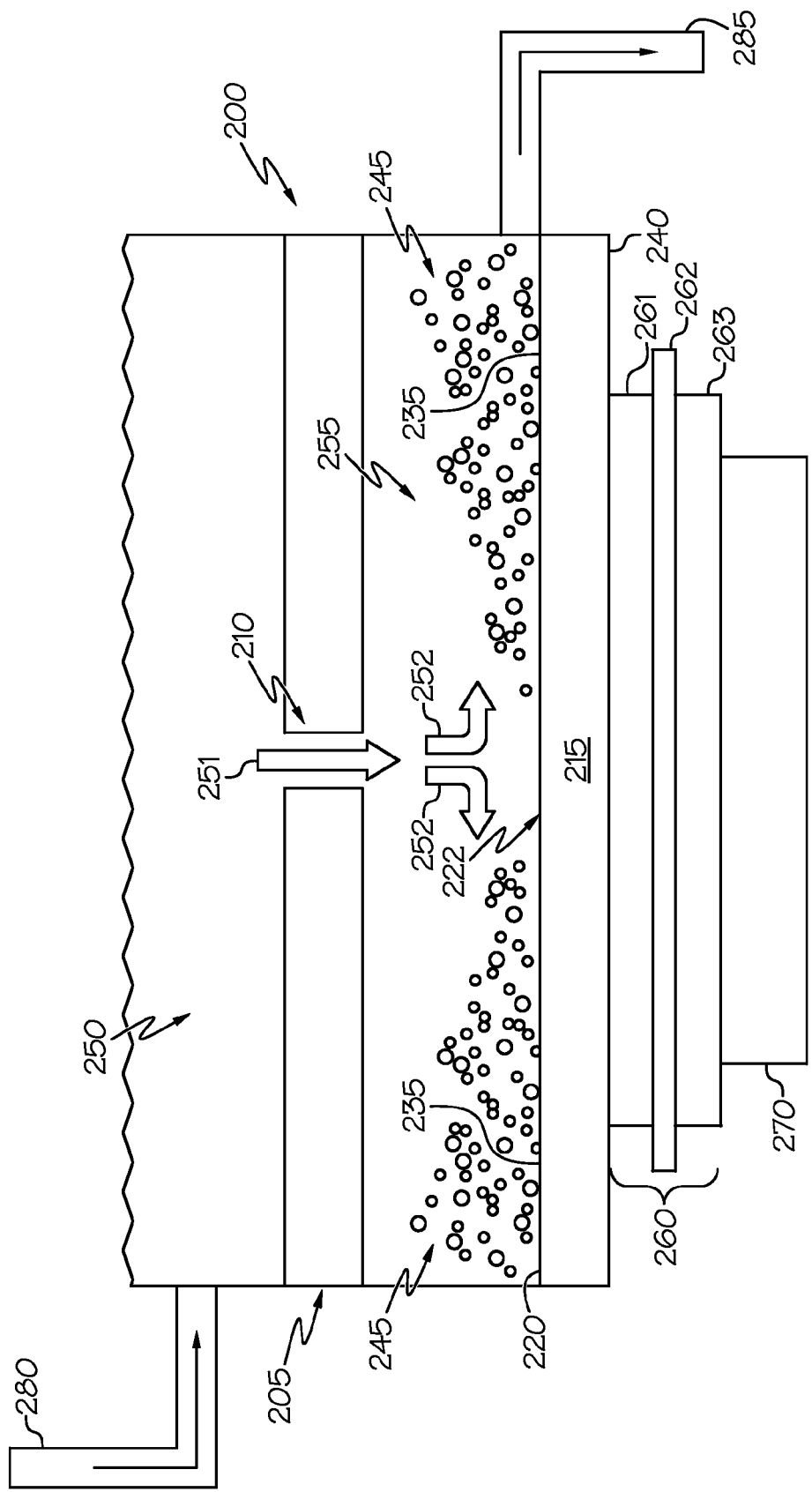
FIG. 2 depicts a schematic diagram of an illustrative two phase cooler according to one or more embodiments shown and described herein.

FIG. 2 depicts an illustrative, nonlimiting two phase cooling apparatus, generally designated 200, according to an embodiment. The two phase cooler 130 illustrated in FIG. 1 may be configured as the two phase cooling apparatus 200 depicted in FIG. 2, for example. The two phase cooling apparatus 200 may be coupled to a substrate assembly 260 and/or a heat generating device 270. The heat generating device 270 is not limited by this disclosure and may generally be any object, substance, or medium having a thermal mass and from which energy in the form of heat can be extracted. A nonlimiting example of the heat generating device 270 may be, for example, a semiconductor device. Illustrative semiconductor devices may include, but are not limited to, insulated gate bipolar transistors (IGBT), metal-oxide-semiconductor field effect transistors (MOSFET), power diodes, power bipolar transistors, power thyristor devices, and the like. In some embodiments, the heat generating device 270 may be included as a component in a power electronics device, such as a component of an inverter and/or converter circuit used to electrically power high load devices, such as electric motors in electrified vehicles (e.g., hybrid vehicles, plug-in hybrid electric vehicles, plug-in electric vehicles, and the like). Other illustrative heat generating devices 270 may include, but are not limited to, mechanical devices such as motors, engines, and/or the like.

In various embodiments, the heat generating device 270 may be thermally coupled to the two phase cooling apparatus 200 such that heat 140 (FIG. 1) from the heat generating device is transferred to fluid in the two phase cooling apparatus. In some embodiments, the heat generating device 270 may be thermally coupled to the cooling apparatus by way of the substrate assembly 260 such that the substrate assembly is positioned between the heat generating device 270 and the cooling apparatus 200. The substrate assembly 260 may include, for example, an insulating dielectric layer 262 disposed between one or more metal layers 261, 263. The substrate assembly 260 may include a direct bonded substrate assembly, such as a direct bonded copper assembly or a direct bonded aluminum assembly. Illustrative materials for the insulating dielectric layer 262 may include, but are not limited to, alumina, aluminum nitride, silicon nitride, silicon carbide, and beryllium oxide. In other embodiments, the heat generating device 270 may be directly coupled to the two phase cooling apparatus 200 such that the heat generating device is coupled to a heat transfer surface 240 of a target layer 215 portion of the cooling apparatus.

The two phase cooling apparatus 200 may generally include one or more inputs 280 that receive the working fluid from the pump 125 (FIG. 1). The one or more inputs 280 may be a conduit that is fluidly coupled to at least a portion of the two phase cooling apparatus 200, such as, for example, a jet channel 250. Thus, the working fluid may travel from the pump 125 (FIG. 1) via the one or more inputs 280 in the direction indicated by the arrow into the two phase cooling apparatus 200.

In some embodiments, the two phase cooling apparatus 200 may also include the target layer 215 that is fabricated from a thermally conductive material, such as, for example, copper and/or aluminum. The target layer 215 may have a target surface 220 that receives the working fluid thereon and a heat transfer surface 240 that is coupled to the substrate assembly 260 or the heat generating device 270, as previously described herein. The two phase cooling apparatus 200 may also optionally contain a jet channel 250 and a jet plate 205. The jet plate 205 may have at least one orifice 210 therethrough such that the working fluid flows into the jet channel 250 and enters the jet orifice 210, as indicated by arrow 251. The working fluid may flow through the orifice 210 as an impingement jet that impinges the target surface 220 on the target layer 215 at an impingement region 222. The impingement region 222 may be generally positioned at a hot spot location created by heat flux generated by the heat generating device 270. After impinging the target surface 220, the working fluid may change direction from being normal to the target surface to flowing parallel to the target surface within an impingement chamber 255, as indicated by arrows 252. The working fluid may flow across the target surface 220 in a flow pattern defined by regions of different fluid velocities. Heat generated by the heat generating device 270 may be transferred from the target layer 215 to the working fluid. In regions of relatively slow fluid flow, some of the working fluid may change phase from a liquid to a vapor by nucleation boiling, as indicated by vapor bubbles 245. In regions of dominant, fast fluid flow, the heat may be removed by convection. The heated working fluid may be removed from the two phase cooling apparatus 200 via one or more outlet ports 285, which direct the heated working fluid towards other components such as the evaporator 105 and/or the expander 110 via the second conduit 155 (FIG. 1), as described in greater detail herein.

In some embodiments, the flow pattern of the working fluid may generally be defined by the jet orifice 210. For example, a jet orifice 210 having a particular shape or geometry may produce a corresponding flow pattern, while a jet orifice having a different shape or geometry from the aforementioned shape or geometry will produce a different flow pattern from the aforementioned flow pattern. The shape of the jet orifice 210 may depend on a temperature profile on the target surface 220 that is generated by the heat generating device 270. The jet orifice 210 may take on a variety of shapes, including, but not limited to, cross-shaped, star-shaped, lobed-shaped, helical, and the like.

In various embodiments, two phase surface enhancement features 235 may be positioned on the target surface 220 at regions associated with low fluid velocity (i.e., non-dominant fluid flow regions). The fluid flow velocity may be defined, for example, by the fluid flow rate. The two phase surface enhancement features 235 may generally be any surface features that increase a number of nucleation sites to promote boiling of the working fluid. Illustrative two phase surface enhancement features 235 may include, but are not limited to, a roughened target surface 220 (e.g., by laser damage, chemical etching, grinding, and/or the like), a thermally conductive film layer having micro- and/or nano-features that is applied to the target surface, micro- and/or nano-features fabricated into the target surface (e.g., by lithography and chemical etching, laser fabrication and/or the like), and a porous area (e.g., a porous coating) of the target surface. For example, the two phase surface enhancement features 235 may be defined by micro-pillars that provide additional surface area to encourage nucleation. However, it should be understood that any surface that encourages nucleation may be used for the two phase surface enhancement features 235.

It should be understood that the two phase cooling apparatus 200 described with respect to FIG. 2 is merely illustrative, and any cooling device that cools with a fluid that converts from a liquid phase to a vapor phase may be used. Other illustrative two phase cooling devices may include, but are not limited to, closed loop cooling systems such as pool boilers and heat pipes, pump-driven two phase cooling devices, cold plate cooling devices, and/or the like.

Referring again to FIG. 1, the condenser 120 may generally be any heat exchanger now known or later developed to cool a working fluid from a vapor state to a liquid state. Thus, the condenser 120 is not limited by the present disclosure. In some embodiments, the condenser 120 may contain one or more inputs, one or more outputs, and a plurality of passages through which the vaporized working fluid and condensed liquid working fluid flows. A cooling medium received via a coolant stream 165 may flow around the passages in the condenser to cause the vaporized working fluid to condense into a liquid working fluid. In some embodiments, the heat from the working fluid may be transferred to a waste stream 170. A nonlimiting example of a condenser may be a finned condenser. A finned condenser includes a plurality of plates and finned chambers to transfer heat. One type of finned condenser is a plate-fin heat exchanger. In some embodiments, a finned condenser may be a plain fin condenser, a herringbone fin condenser, a serrated fin condenser, or a perforated fin condenser. A plain fin condenser may generally refer to a condenser that uses a simple straight-finned triangular or rectangular design. A herringbone fin condenser may generally refer to a condenser that uses fins that are placed sideways in a zigzag pattern. A serrated fin condenser and a perforated fin condensers may generally be condensers that contain fins that are cut and perforated, respectively, to augment flow distribution and improve heat transfer. In some embodiments, the condenser 120 may be assisted in the condensing process by one or more fans (not shown). The one or more fans may operate to circulate air to the condenser 120, thereby cooling the condenser, which, in turn, cools the vapor therein, causing it to condense into a liquid.

The expander 110 is not limited by this disclosure, and may generally include any device used for extracting work out of a compressed fluid by decreasing its pressure. Illustrative expanders may include, but are not limited to, positive displacement expanders and impulse turbines. A positive displacement expander may include at least one chamber that receives the working fluid, where one or more walls or surfaces of the chamber can move under the pressure of the working fluid, thereby expanding the volume of the chamber. Examples of positive displacement expanders may include, but are not limited to, a multistage piston expansion machine wherein the first stage cylinder is smaller than the cylinders of subsequent expansion stages, with the displacement of each stage approximately proportional to the intake pressure of the working fluid to that stage. Alternative rotary positive displacement devices (also known as rotary engines) may include scroll machines, twin screw machines, and other machines with twin contra-rotating and intermeshing rotors. An impulse turbine may be provided with stages having partial admission nozzles that operate at very high speed, such as, for example, about 100,000 RPM. In a nonlimiting example, a three stage impulse turbine may have three separate wheels, where each wheel has a partial admission nozzle. Alternatively, the impulse turbine may have one wheel using re-entry nozzles and return ducts to define the separate stages of expansion in the wheel over corresponding angular sectors of a casing for several stages.

In some embodiments, the expander 110 may be configured to produce an amount of mechanical power from the compressed fluid. For example, the expander may produce a mechanical power of about 1 watt (W) to about 3 kilowatts (kW), including about 1 W, about 10 W, about 100 W, about 250 W, about 500 W, about 0.5 kW, about 1 kW, about 1.5 kW, about 2 kW, about 2.5 kW, about 3 kW, or any value or range between any two of these values (including endpoints). Such an amount of mechanical power may be produced, for example, when the compressed fluid has a temperature of about 0° C. to about 100° C., including about 0° C., about 10° C., about 20° C., about 30° C., about 40° C., about 50° C., about 60° C., about 70° C., about 80° C., about 90° C., about 100° C., or any value or range between any two of these values (including endpoints). Such an amount of mechanical power may be produced, for example, when the expander 110 has a pressure ratio of about 1 to about 10, including about 1, about 2, about 3, about 4, about 5, about 6, about 7, about 8, about 9, about 10, or any value or range between any two of these values (including endpoints). It will be recognized that the pressure ratio refers to a ratio of the pressure of the working fluid when entering the expander 110 to the pressure of the working fluid when exiting the expander 110. Thus, if the working fluid has a pressure that is 5 times greater at entry into the expander 110 than at exit from the expander, then the pressure ratio is 5. In a particular embodiment, the expander 110 may produce, for example, about 1.4 kW to about 1.5 of power by expanding the working fluid at a pressure ratio of 5.

In some embodiments, the expander 110 may be coupled with a generator 115. The generator 115 may generally convert the extracted work from the expander 110 into electrical energy. It may be generally recognized that the generator 115 may include any type of apparatus or system that converts work (i.e., power or energy) into electric power or energy. Illustrative generators may include, but are not limited to, engine-driven generators, ram-air turbines, auxiliary power units, alternators, and the like. It may be further be recognized that certain devices which incorporate the expander 110 and the generator 115 to extract electrical energy from the working fluid may be used. The generated electrical energy may be used for any device receiving electricity, regardless of whether such devices are described herein. In some embodiments, the generated electrical energy may be used to power various components of the system 100. In some embodiments, the generated electrical energy may be stored in a battery or similar storage device. In some embodiments, the generated electrical energy may be used to power various power electronics devices, such as the power electronics devices described herein.

The various conduit 155, 160, 175 described herein is not limited by this disclosure and may generally include any device configured to carry a fluid in either a liquid state or a vapor state. Nonlimiting examples of conduit may include, but are not limited to, pipes, tubing, channels, or other enclosed structures that may exhibit a circular or non-circular cross section. The conduit 115, 160, 175 may be any length and may be composed of any material, particularly materials generally recognized for transporting the working fluid. The various conduit 155, 160, 175 may further be fluidly coupled to the various components of the Rankine cycle, particularly such that the working fluid is wholly contained within the various components of the Rankine cycle.

Figure 3:
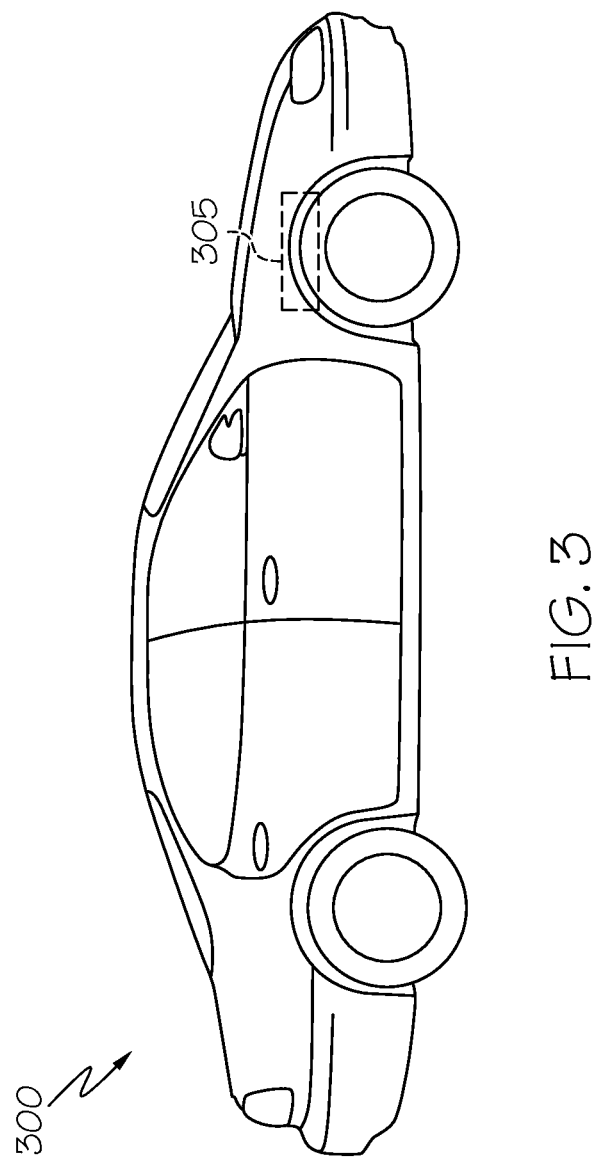
FIG. 3 depicts a side view of an illustrative vehicle containing a cooling cycle according to one or more embodiments shown and described herein.

As previously described herein, the system 100 may be configured to cool any heat generating device, such as, for example, semiconductor devices. As shown in FIG. 3, certain heat generating devices may be located in a vehicle 300. As such, the system 305 may be incorporated within the vehicle 300 such that the system is coupled to the one or more heat generating devices. Accordingly, the system 305 may be mounted to one or more portions of the vehicle 300. For example, in some embodiments, the two stage cooler portion of the system 305 may be coupled to one or more vehicle power electronics devices and an evaporator portion of the system may be coupled to the vehicle exhaust system. It may be recognized that other vehicle components may be coupled to various portions of the system 305 without departing from the scope of the present disclosure.

Figure 4:
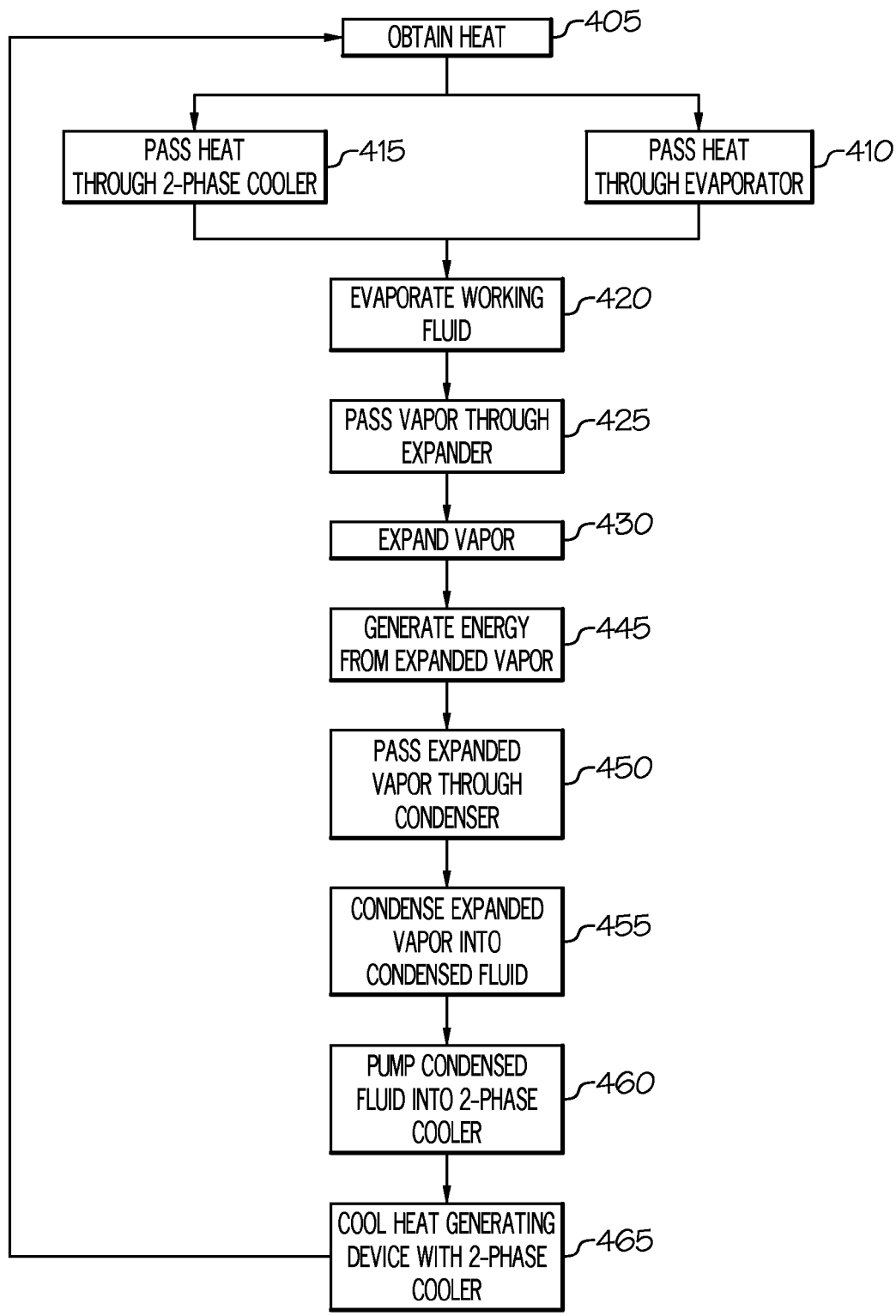
FIG. 4 depicts a flow diagram of an illustrative method of cooling one or more components according to one or more embodiments shown and described herein.

FIG. 4 depicts a flow diagram of an illustrative method of cooling a heat generating device according to an embodiment. The method described with respect to FIG. 4 may generally be completed by the various components described herein. Heat may be obtained 405 from various sources, such as, for example, a heat generating device (i.e., a power electronics device) a waste heat source (i.e., an exhaust), and/or the like. The heat may be passed 410, 415 through the two phase cooler and/or the evaporator. As described herein, in some embodiments, heat from a heat generating device may be passed 415 through the two phase cooler to heat the working fluid. In some embodiments, heat from a waste heat source may be passed 410 through the evaporator to heat the working fluid. In other embodiments, heat from the same source may be passed 410, 415 though both the evaporator and the two phase cooler to heat the working fluid. In some embodiments, heat may be passed 410 though the evaporator at substantially the same time as heat is passed 415 though the two phase cooler, particularly in embodiments when the evaporator is arranged in parallel with the two phase cooler. In other embodiments, heat may be passed 415 through the two phase cooler first to preheat the working fluid, and then heat may be passed 410 through the evaporator to further heat the working fluid, particularly in embodiments where the two phase cooler is positioned upstream to the evaporator, as described in greater detail herein.

The evaporator may heat the working fluid such that it evaporates 420 and may pass 425 the vapor through the expander, as described in greater detail herein. Once in the expander, the expander may expand 430 the vapor to extract work therefrom, thereby allowing the generator to generate 445 energy. The expanded vapor may be passed 450 through the condenser, which may condense 455 the working fluid back into a liquid state. The pump may pump 460 the condensed working fluid to the two phase cooler and/or the evaporator, as described in greater detail herein. Accordingly, the two phase cooler may use the liquid working fluid to cool 465 the heat generating device and repeat the process of obtaining 405 heat.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling system comprising:
   an evaporator;
   a condenser positioned downstream from the evaporator;
   a pump positioned downstream from the condenser; and
   a two phase cooler positioned downstream from the pump and in series upstream from the evaporator, wherein the two phase cooler receives thermal energy from a heat generating device to preheat a working fluid.

2. The cooling system of claim 1, wherein the heat generating device is a power electronics device thermally coupled to the two phase cooler.

3. The cooling system of claim 2, wherein the two phase cooler cools the heat generating device.

4. The cooling system of claim 1, wherein the evaporator receives thermal energy from a waste heat source to vaporize the preheated working fluid.

5. The cooling system of claim 1, wherein the cooling system is a Rankine cycle cooling system.

6. The cooling system of claim 1, further comprising:
   an expander positioned downstream from the evaporator and upstream from the condenser; and
   a generator coupled to the expander, wherein:
     the expander receives a vaporized working fluid from the evaporator, allows the vaporized working fluid to expand, and produces work from the expanded working fluid, and
     the generator uses the produced work to generate electrical energy.

7. The cooling system of claim 6, wherein the electrical energy powers one or more components of the power electronics cooling system.

8. A cooling system comprising:
   an evaporator;
   a condenser positioned downstream from the evaporator;
   a pump positioned downstream from the condenser; and
   a two phase cooler positioned downstream from the pump and in parallel with the evaporator, wherein the evaporator and the two phase cooler each receive thermal energy to heat a working fluid.

9. The cooling system of claim 8, wherein at least one of the evaporator and the two phase cooler receives the thermal energy from an exhaust heat source.

10. The cooling system of claim 8, wherein the two phase cooler receives the thermal energy from a heat generating device.

11. The cooling system of claim 10, wherein the heat generating device is a power electronics device coupled to the two phase cooler.

12. The cooling system of claim 11, wherein the two phase cooler cools the heat generating device.

13. The cooling system of claim 8, wherein the cooling system is a Rankine cycle cooling system.

14. The cooling system of claim 8, further comprising:
an expander positioned downstream from the evaporator and the two phase cooler and upstream from the condenser; and
a generator coupled to the expander, wherein:
the expander receives a vaporized working fluid from the evaporator and the two phase cooler, allows the vaporized working fluid to expand, and produces work from the expanded working fluid, and
the generator uses the produced work to generate electrical energy.

15. The cooling system of claim 14, wherein the electrical energy powers one or more components of the power electronics cooling system.

16. A vehicle comprising:
a power electronics device;
an evaporator that receives a stream of waste heat, wherein the evaporator transfers thermal energy from the waste heat to a working fluid to vaporize the working fluid;
an expander positioned downstream from the evaporator, wherein the expander receives the vaporized working fluid from the evaporator, allows the vaporized working fluid to expand, and produces work from the expanded working fluid;
a condenser positioned downstream from the expander, wherein the condenser receives the expanded vaporized working fluid from the expander and cools the expanded vaporized working fluid to a liquid working fluid;
a pump positioned downstream from the condenser, wherein the pump draws the liquid working fluid from the condenser; and
a cooler positioned downstream from the pump and upstream from the evaporator such that the liquid working fluid is pumped into the cooler from the condenser, wherein the cooler receives thermal energy from the power electronics device to preheat the liquid working fluid and directs the preheated working fluid to the evaporator.

17. The vehicle of claim 16, wherein the cooler is thermally coupled to the power electronics device.

18. The vehicle of claim 16, wherein the stream of waste heat is obtained from a vehicle exhaust.

19. The vehicle of claim 16, wherein the power electronics device comprises one or more of an insulated gate bipolar transistor (IGBT), a metal-oxide-semiconductor field effect transistor (MOSFET), a power diode, a power bipolar transistor, and a power thyristor device.

20. The vehicle of claim 16, further comprising a generator coupled to the expander, wherein the generator uses the produced work to generate electrical energy.

* * * * *